United States Patent [19]
Levine et al.

[11] Patent Number: 6,000,053
[45] Date of Patent: Dec. 7, 1999

[54] ERROR CORRECTION AND LOSS RECOVERY OF PACKETS OVER A COMPUTER NETWORK

[75] Inventors: Earl Levine, Palo Alto; Phil Chou, Menlo Park, both of Calif.

[73] Assignee: Microsoft Corporation, Redmond, Wash.

[21] Appl. No.: 08/876,139

[22] Filed: Jun. 13, 1997

[51] Int. Cl.$^6$ .............................. H03M 13/00; H04J 3/16
[52] U.S. Cl. .......................... 714/766; 714/752; 370/470
[58] Field of Search ............................... 371/37.01, 39.1, 371/38.1, 2.1, 2.2; 395/185.01, 185.02, 185.05; 364/266.3; 370/470, 472, 474, 476, 471, 465; 714/766

[56] References Cited

U.S. PATENT DOCUMENTS

| | | | |
|---|---|---|---|
| 4,771,391 | 9/1988 | Blasbalg | 709/232 |
| 5,307,351 | 4/1994 | Webster | 370/470 |
| 5,309,450 | 5/1994 | Kim | 371/39.1 |
| 5,432,787 | 7/1995 | Chethik | 370/473 |
| 5,524,116 | 6/1996 | Kalmanek, Jr. et al. | 371/37.01 |
| 5,608,738 | 3/1997 | Matsushita | 371/37.01 |
| 5,642,365 | 6/1997 | Murakami et al. | 371/38.1 |

OTHER PUBLICATIONS

Hagenauer, J., "Rate–Compatible Punctured Convolutional Codes (RCPC Codes) and Their Applications", *IEEE Transactions on Communications*, vol. 36, No. 4, 389–400, (Apr. 1988).

Ohta, N., *Packet Video: Modeling and Signal Processing*, Norwood, MA: Artech House, Inc., 144–153, (1994).

*Primary Examiner*—Albert De Cady
*Assistant Examiner*—Shelly A Chase
*Attorney, Agent, or Firm*—Schwegman, Lundberg, Woessner & Kluth, P.A.

[57] ABSTRACT

A method of recovering a lost or corrupted data packet of a plurality of data packets transmitted by a transmitting computer system to a target computer system over an unreliable computer network. In one embodiment, the transmitting computer system generates parity information by padding the plurality of data packets to the length of the longest data packet with a suitable bit pattern. The parity information is then generated using a suitable algorithm, such as an exclusive OR (XOR) operation. The parity information and the packet lengths of the data packets are used to form the parity packet. The transmitting computer system then sends both the data packets and the parity packet to the target computer. If the target computer system detects a lost or corrupted data packet, the target computer attempts to reconstruct the lost or corrupted data packet. The received uncorrupted data packets are padded with the suitable bit pattern described above. Note that it is useful to pad up to the length of the lost data packet. The inverse operation of the parity generating algorithm is then applied to the padded data packets and the parity packet to reconstruct the lost or corrupted data packet.

33 Claims, 7 Drawing Sheets

ERROR CORRECTION AND LOSS RECOVERY OF PACKETS OVER A COMPUTER NETWORK

BACKGROUND OF THE INVENTION

1. Field of the Invention

The present invention relates to network reliability. More particularly, the present invention relates to the recovery of lost data packets over a network.

2. Description of the Related Art

With the proliferation of connections to the internet by a rapidly growing number of consumers, traffic on the internet has increased correspondingly. As a result, network congestion and the loss of data packets at the network level are serious problems.

While higher level protocols such as TCP/IP can guarantee packet arrival in an otherwise low reliability network, reliability is generally accomplished at the cost of increased overhead resulting from additional handshaking and retransmissions. Hence, efficiency is sacrificed for increased reliability.

There are several conventional schemes for increasing network level reliability. One conventional scheme for recovering of lost/corrupted data packets is striping. Striping involved the generation and transmission of parity information for a block of data packets having equal packet lengths. Accordingly, striping is not suitable for data packets having unequal packet lengths.

Another conventional scheme for error recovery of corrupted data packets is packet-level parity in which parity information of each data packet is embedded within and transmitted with the respective data packets. However, in the case of a catastrophic loss, e.g., a loss of the entire packet, embedded parity information is not helpful because the parity information was transmitted with the data packet, and presumed to have suffered the same fate, e.g., lost, as the data portion of the data packet.

In view of the foregoing, there are desired improved techniques for efficient recovery of lost/corrupted packets having different packet lengths transmitted over a computer network which efficiently utilizes the network resources.

SUMMARY OF THE INVENTION

The present invention recovers a lost or corrupted data packet of a plurality of data packets transmitted by a transmitting computer system to a target computer system over an unreliable computer network.

In one embodiment, the transmitting computer system generates parity information by padding the plurality of data packets to the length of the longest data packet with a suitable bit pattern. The parity information is then generated using a suitable algorithm, such as an exclusive OR (XOR) operation. The parity information and the packet lengths of the data packets are used to form the parity packet. The transmitting computer system then sends both the data packets and the parity packet to the target computer.

Since the computer network is not always reliable, occasionally one of the data packets is either lost or corrupted while in the process of being transmitted from the transmitting computer system to the target computer system. If the target computer system detects such a lost or corrupted data packet, then the target computer attempts to reconstruct the lost or corrupted data packet.

First the received uncorrupted data packets are padded with the suitable bit pattern described above. Note that it is useful to pad up to the length of the lost data packet. The inverse operation of the parity generating algorithm is then applied to the padded data packets and the parity packet to reconstruct the lost or corrupted data packet.

These and other advantages of the present invention will become apparent upon reading the following detailed descriptions and studying the various figures of the drawings.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1:
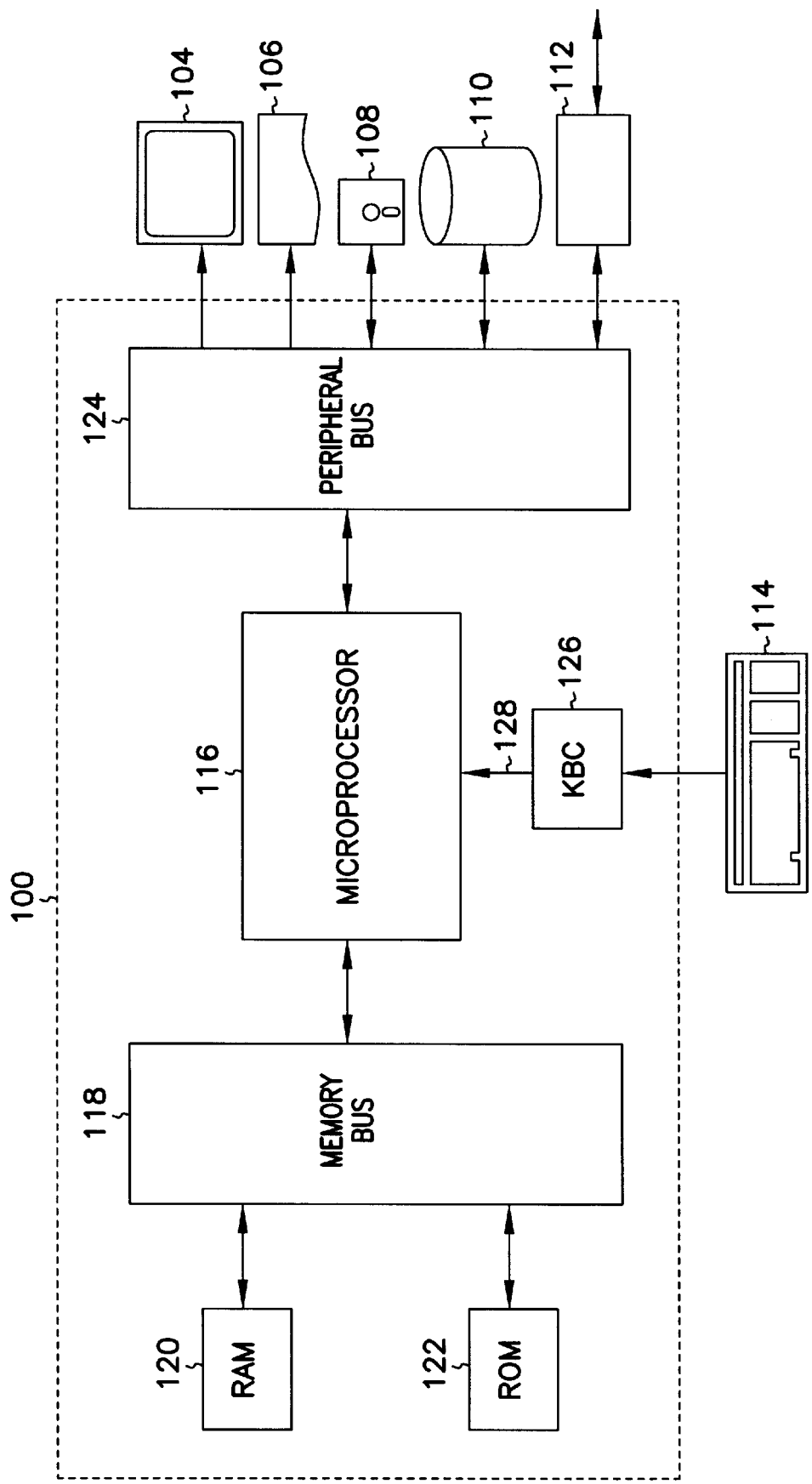
FIG. 1 is a block diagram of an exemplary computer system for practicing the various aspects of the present invention.

FIG. 1 is a block diagram of an exemplary computer system 100 for practicing the various aspects of the present invention. Computer system 100 includes a display screen (or monitor) 104, a printer 106, a floppy disk drive 108, a hard disk drive 110, a network interface 112, and a keyboard 114. Computer system 100 includes a microprocessor 116, a memory bus 118, random access memory (RAM) 120, read only memory (ROM) 122, a peripheral bus 124, and a keyboard controller 126. Computer system 100 can be a personal computer (such as an Apple computer, e.g., an Apple Macintosh, an IBM personal computer, or one of the compatibles thereof), a workstation computer (such as a Sun Microsystems or Hewlett-Packard workstation), or some other type of computer.

Microprocessor 116 is a general purpose digital processor which controls the operation of computer system 100. Microprocessor 116 can be a single-chip processor or can be implemented with multiple components. Using instructions retrieved from memory, microprocessor 116 controls the reception and manipulation of input data and the output and display of data on output devices.

Memory bus 118 is used by microprocessor 116 to access RAM 120 and ROM 122. RAM 120 is used by microprocessor 116 as a general storage area and as scratch-pad memory, and can also be used to store input data and processed data. ROM 122 can be used to store instructions or program code followed by microprocessor 116 as well as other data.

Peripheral bus 124 is used to access the input, output, and storage devices used by computer system 100. In the described embodiment(s), these devices include display screen 104, printer device 106, floppy disk drive 108, hard disk drive 110, and network interface 112. Keyboard controller 126 is used to receive input from keyboard 114 and send decoded symbols for each pressed key to microprocessor 116 over bus 128.

Display screen 104 is an output device that displays images of data provided by microprocessor 116 via peripheral bus 124 or provided by other components in computer system 100. Printer device 106 when operating as a printer provides an image on a sheet of paper or a similar surface. Other output devices such as a plotter, typesetter, etc. can be used in place of, or in addition to, printer device 106.

Floppy disk drive 108 and hard disk drive 110 can be used to store various types of data. Floppy disk drive 108 facilitates transporting such data to other computer systems, and hard disk drive 110 permits fast access to large amounts of stored data.

Microprocessor 116 together with an operating system operate to execute computer code and produce and use data. The computer code and data may reside on RAM 120, ROM 122, or hard disk drive 120. The computer code and data could also reside on a removable program medium and loaded or installed onto computer system 100 when needed. Removable program mediums include, for example, CD-ROM, PC-CARD, floppy disk and magnetic tape.

Network interface circuit 112 is used to send and receive data over a network connected to other computer systems. An interface card or similar device and appropriate software implemented by microprocessor 116 can be used to connect computer system 100 to an existing network and transfer data according to standard protocols.

Keyboard 114 is used by a user to input commands and other instructions to computer system 100. Other types of user input devices can also be used in conjunction with the present invention. For example, pointing devices such as a computer mouse, a track ball, a stylus, or a tablet can be used to manipulate a pointer on a screen of a general-purpose computer.

The present invention can also be embodied as computer readable code on a computer readable medium. The computer readable medium is any data storage device that can store data which can be thereafter be read by a computer system. Examples of the computer readable medium include read-only memory, random-access memory, magnetic data storage devices such as diskettes, and optical data storage devices such as CD-ROMs. The computer readable medium can also be distributed over a network coupled computer systems so that the computer readable code is stored and executed in a distributed fashion.

Figure 2:
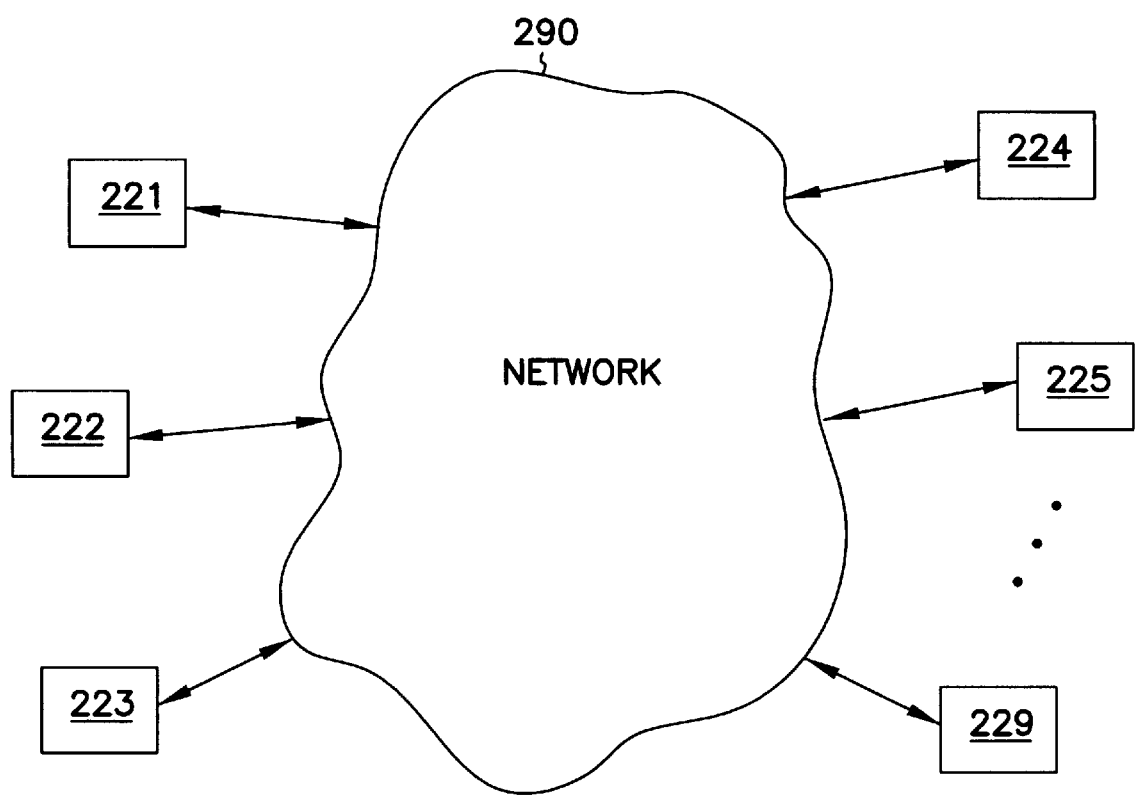
FIG. 2 is a block diagram showing an exemplary hardware environment for practicing the present invention.

FIG. 2 is a block diagram showing an exemplary hardware environment for practicing the present invention, including a plurality of computer systems 221, 222, 223, 224, 225 . . . 229, each of which can be implemented using computer system 100 described above. Computer systems 221, 222, 223, 224, 225, . . . 229 are coupled to each other via a computer network 290.

Figure 3A:
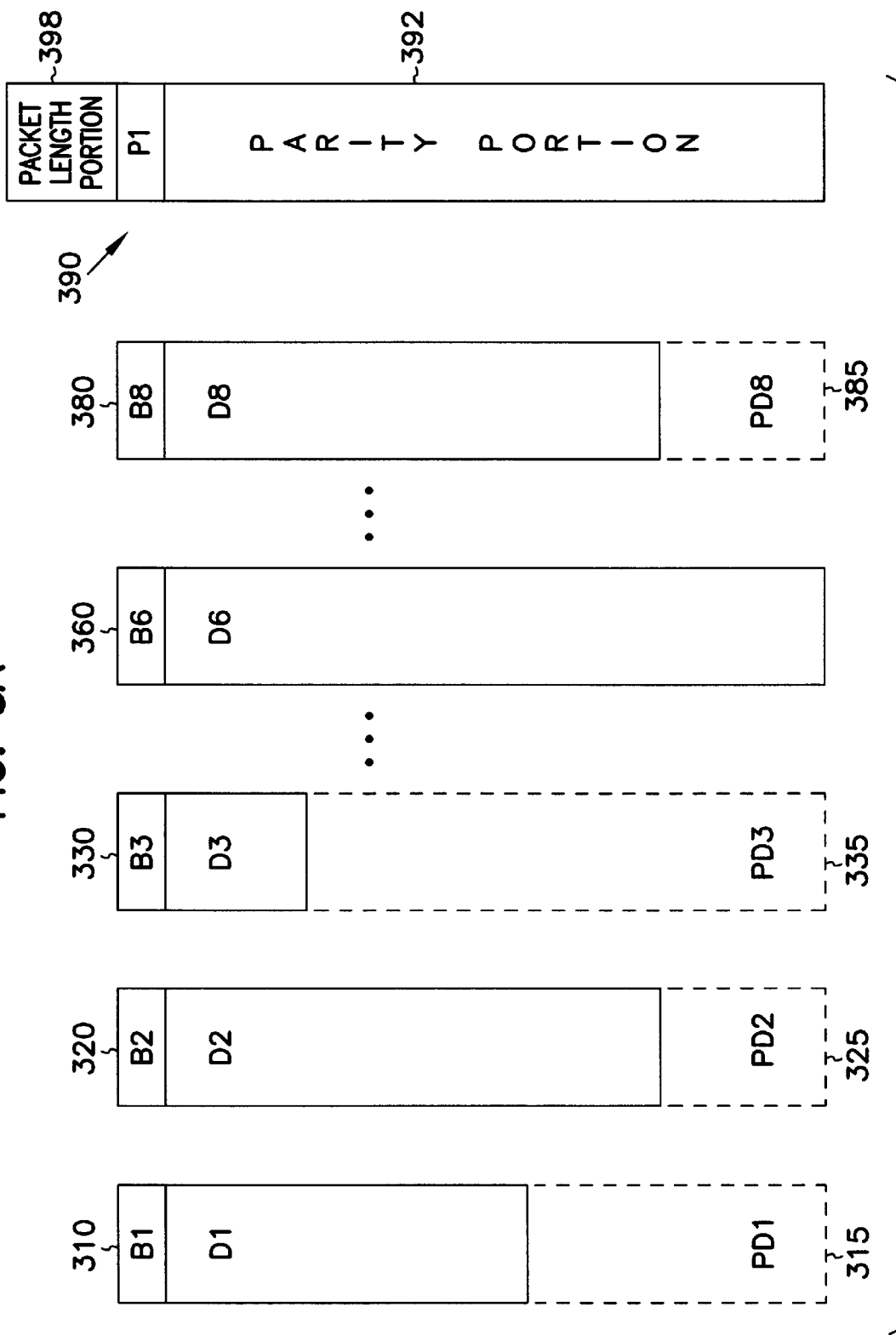
FIG. 3A is a block diagram of a plurality of data packets and a parity packet of the present invention.

In accordance with the invention, a transmitting computer system, e.g., system 222, transmits a plurality of data packets 310, 320, 330, . . . , 360, . . . 380, illustrated in FIG. 3A, to a target computer system, e.g., system 225. In this example, five data packets are transmitted from system 222 to system 225. However, the invention applies to the transmission two or more data packets, with at least two data packets having different packet lengths. Accordingly, the present invention is useful for transmitting data packets from multiple sources, e.g., video data packets interleaved with audio data packets. Note that the present invention is applicable to both point-to-point transmissions or multicast transmissions.

Figure 4:
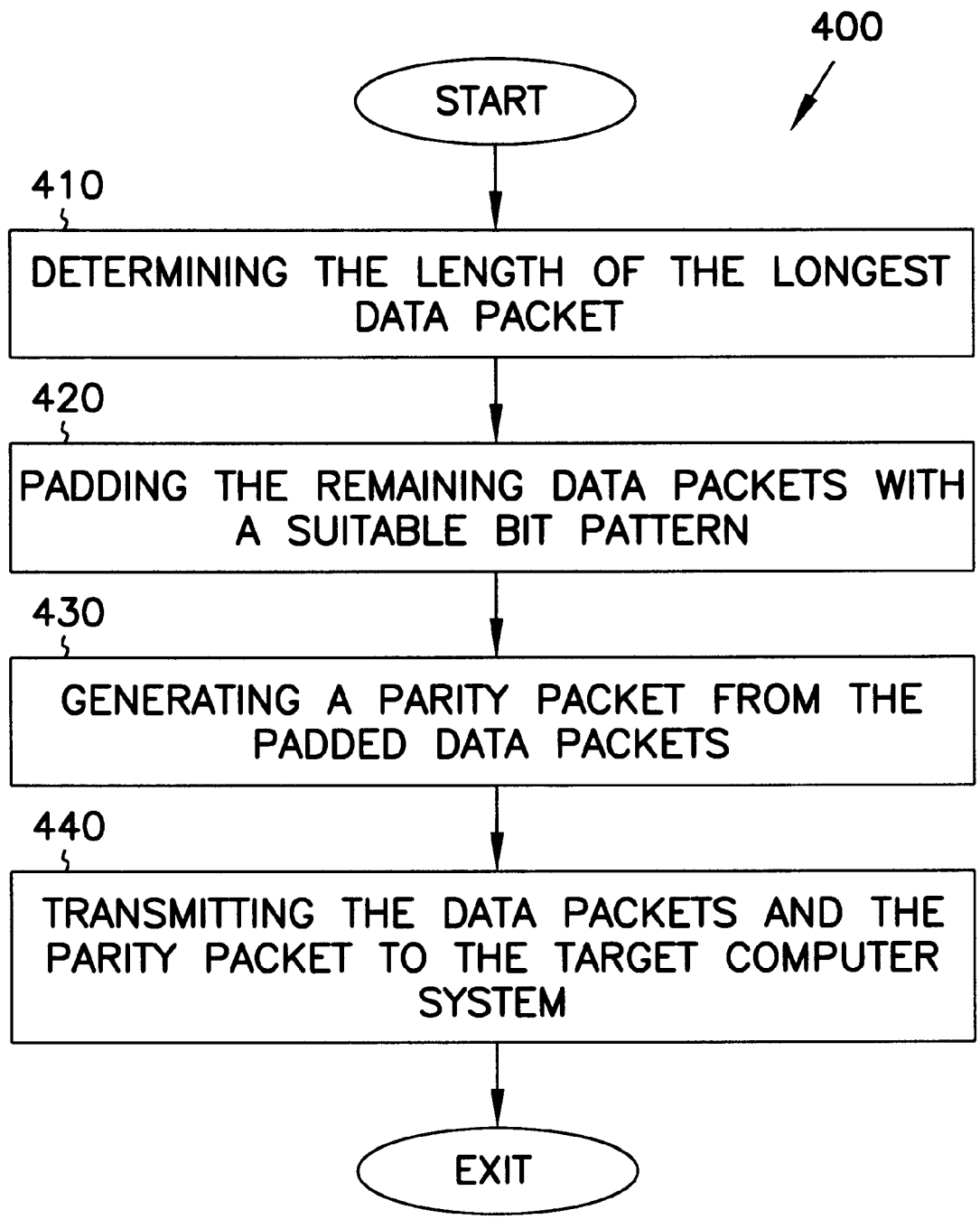
FIG. 4 is a flowchart illustrating the operation of a transmitting computer system including the generation of the parity packet.

Referring now to the flowchart of FIG. 4, transmitting computer system 222 determines the length of the longest data packet of the plurality of data packets 310, 320, 330, . . . , 360, . . . 380 (step 410). In this example, data packet 360 is the data packet with the longest packet length.

Next, the remaining data packets 310, 320, 330, . . . 380 which are shorter in packet length, are padded with a suitable bit pattern, thereby generating a corresponding plurality of padded data packets which include padded portions 315, 325, 335, . . . 385, respectively (step 420). Suitable padding bit patterns include all "1"s, all "0"s, and alternating "1"s and "0"s.

Figure 3B:
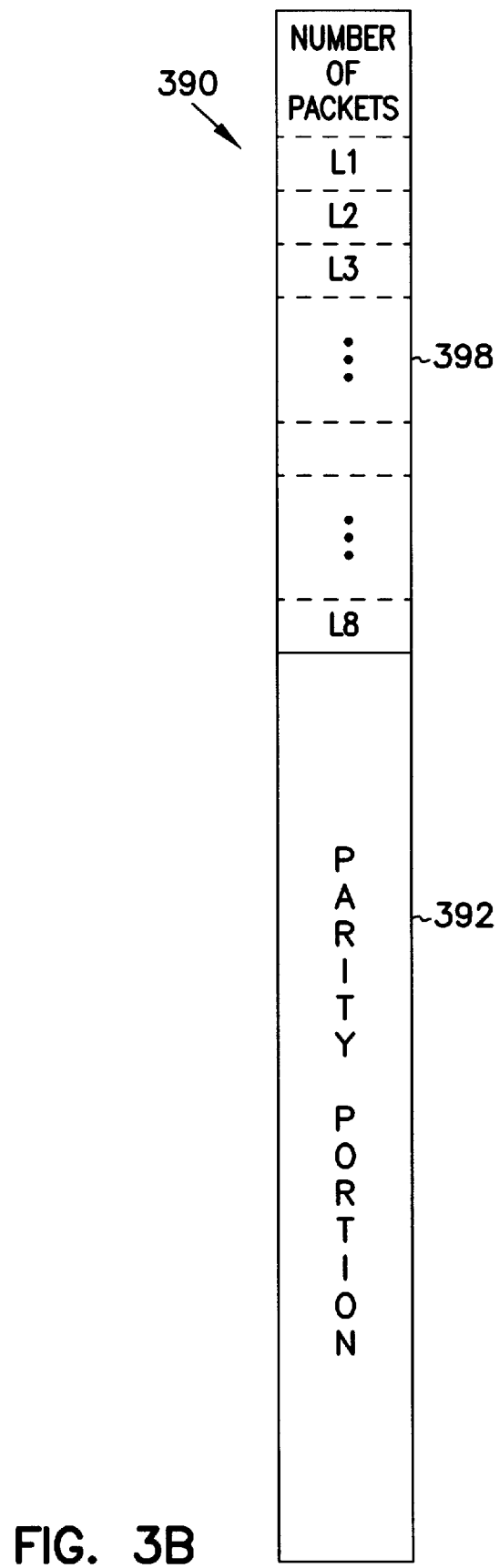
FIG. 3B shows the parity packet of FIG. 3A in greater detail.

In step 430, a parity packet 390 is generated from data packets 310, 320, 330, . . . 360, . . . 380 and padded portions 315, 325, 335, . . . 385. Suitable parity generating algorithms known to one skilled in the art include relatively simple operations such as exclusive "OR" ("XOR") and "Hamming Code". For example, the respective first bits B1, B2, B3, . . . B6, . . . B8 of data packets 310, 320, 330, 360, . . . 380 are XORed and the resulting bit value forms a first parity bit P1 of parity packet 390. Accordingly, as illustrated by FIGS. 3A and 3B, parity packet 390 includes a parity portion 392 which is equal in length to the longest data packet 360. Parity packet 390 also includes a packet length portion 398 which includes packet lengths L1, L2, L3, . . . L6, . . . L8 of data packets 310, 320, 330, . . . 360, . . . 380.

Note that the above described parity packet format is only exemplary and other parity packet formats are also possible. Data packets 310, 320, 330, . . . 360, . . . 380 and parity packet 390 may also include additional packet fields, e.g., packets headers, known to one skilled in the art and hence not described in detail.

In step 440, transmitting computer system 222 transmits data packets 310, 320, 330, . . . 360, . . . 380 and parity packet 390 to target computer system 225. In accordance with one aspect of the invention, padded portions 315, 325, 335, . . . 385 are not transmitted to target computer system 225. This is because the padding bit pattern used to generate padded portions 315, 325, 335, . . . 385 is known to target computer system 225 and hence can be regenerated by target computer system 225 as needed. By transmitting data packets 310, 320, 330, . . . 360, . . . 380 without padded portions 315, 325, 335, . . . 385, usage of network 290 is advantageously reduced thereby improving network efficiency.

Figure 5:
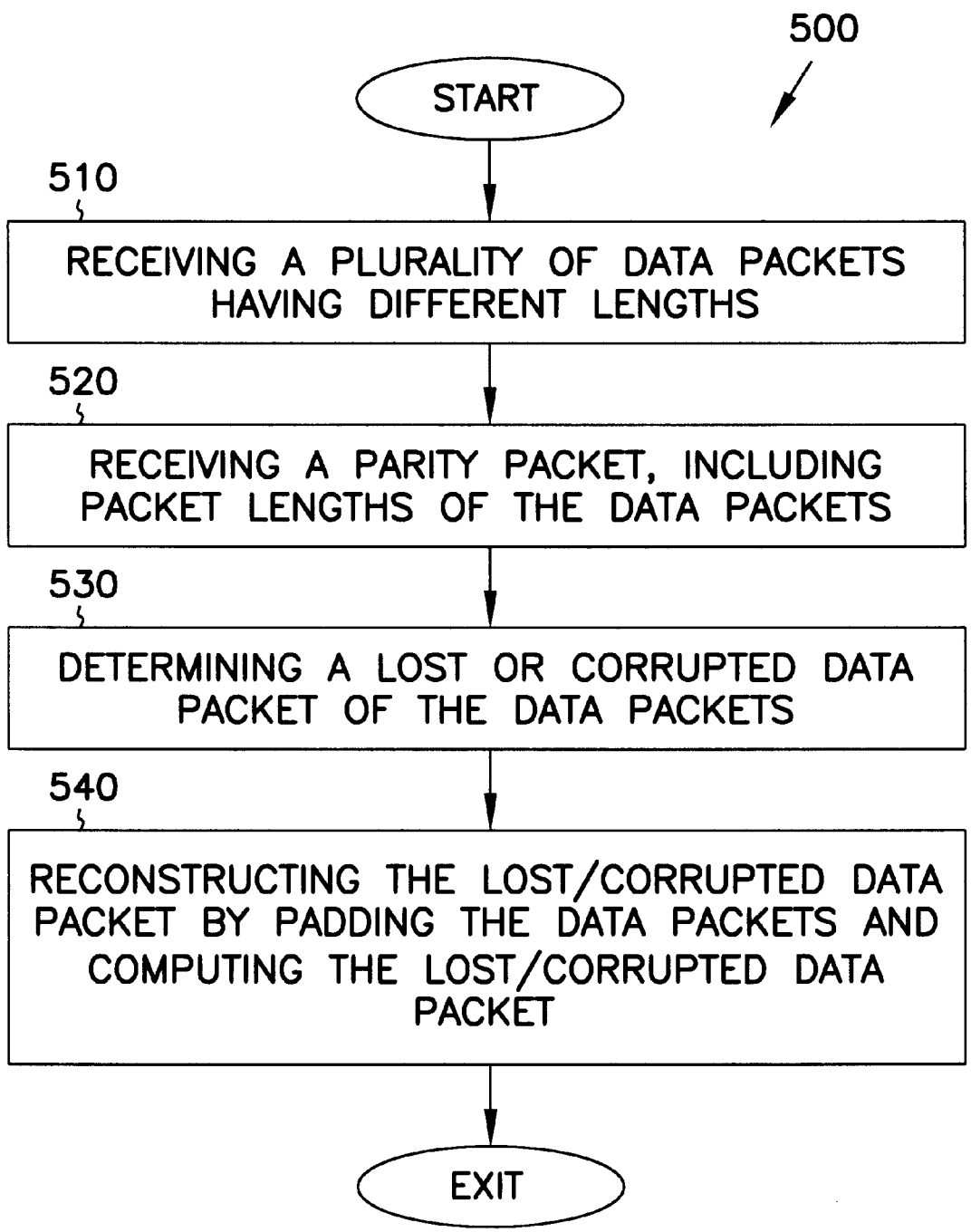
FIG. 5 is a flowchart illustrating the operation of a receiving computer system including the reconstruction of a lost or corrupted data packet.

Referring now to the flowchart of FIG. 5, target computer system 225 is configured to receiving data packets 310, 320, 330, . . . 360, . . . 380 from transmitting computer system 222 (step 510). In addition, target computer system 225 also receives parity packet 390 from transmitting computer system 222 (step 520).

However, computer network 290 does not guarantee packet delivery at the network level. Accordingly, it is possible that one of the data packets 310, 320, 330, . . . 360, . . . 380, e.g., packet 380, is either lost or corrupted, before arriving at target computer system 225. Hence, in this example, data packet 380 is lost somewhere in network 290 and does not arrive at target computer system 225 by a predetermined time (step 530).

In step 540, target computer system 225 reconstructs the lost data packet 380 by executing an inverse of the parity generation steps described above. First, target computer system 225 retrieves the packet length L8 of the lost data packet 380. As discussed above, packet length L8 is transmitted to target computer system 225 in the packet length portion 398 along with the parity portion 392 in the parity packet 390. The remaining received data packets 310, 320, and 330, which are shorter in packet length than the lost packet 380, are padded at least up to the length L8 of the lost data packet 380. Next, the inverse of the parity generation algorithm, e.g. "XOR", is used to reconstruct each bit of the missing data packet 380 from the padded versions of the data packets 310, 320, 330 and data packet 360.

Alternatively, although less efficient, it is also possible to reconstruct lost data packet by simply padding all the received data packets up the size of the longest data packet.

Figure 6:
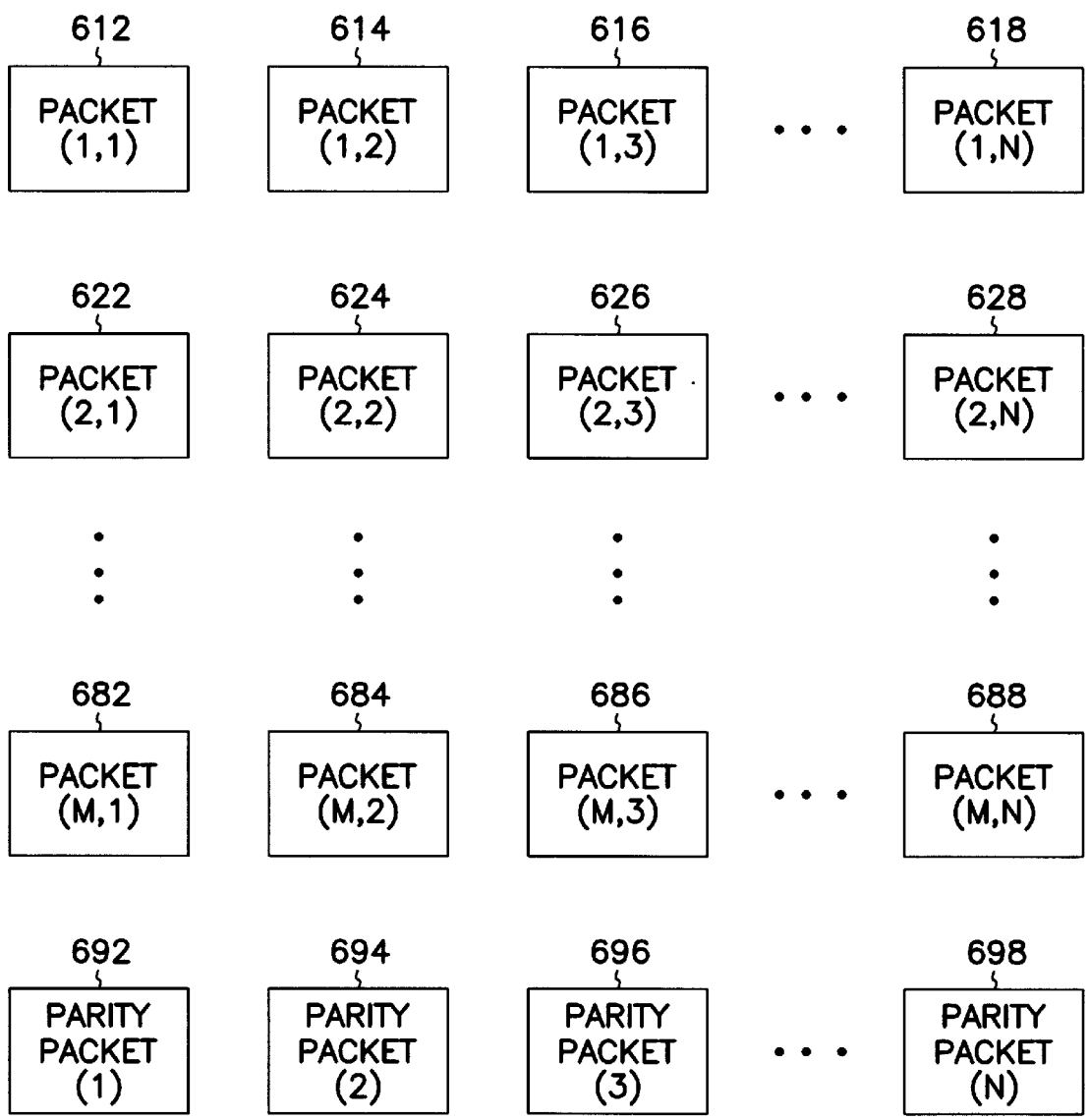
FIG. 6 is a block diagram showing an arrangement of the data packets for generating parity packets.

FIG. 6 is a block diagram illustrating another aspect of the invention, in which parity packets are generated from an exemplary interleaved arrangement of data packets. Sequentially, i.e., when sorted by timestamps, the arrangement comprises data packets 612, 614, 616, . . . 618, data packets 622, 624, 626, . . . 628, . . . and data packets 682, 684, 686, . . . 688. However, parity packets are computed from interleaved data packets distributed at a suitable packet interval, e.g., parity packet 692 is computed from the exemplary arithmetic progression of data packets 612, 622, . . . 682.

Such an interleaved arrangement is advantageous because statistically network errors tend to occur in bursts, e.g., a loss of data packets 624 and 626 due to a transitory network congestion. This is because, without interleaving, the loss of two consecutive packets 624, 626, may not be recoverable since they are likely to share the same parity packet. Instead, as shown in FIG. 6, interleaved data packets 624 and 626 are distributed and are each associated with parity packets 694, 696, respectively. Hence, interleaving substantially reduces the probability of unrecoverable packet losses due to network problems.

Note that while the present invention provides error recovery for variable length data packets, it is understood that the invention is also applicable to interleaved data packets of equal length, either alone or in combination with variable length data packets.

While this invention has been described in terms of several preferred embodiments, there are alterations, permutations, and equivalents which fall within the scope of this invention. For example, although the present error recovery invention is described using computer systems coupled to each other via a network, the methods and apparatuses of the present invention are equally applicable to other error recovery environments. It is therefore intended that the following appended claims be interpreted as including all such alterations, permutations, and equivalents as fall within the true spirit and scope of the present invention.

What is claimed is:

1. In a transmitting computer system, a method for reliably transmitting a plurality of data packets from the transmitting computer system to a target computer system, the transmitting computer system and the target computer system coupled to each other via a computer network, wherein at least two of the plurality of data packets have different packet lengths, the method comprising:

determining the length of a longest data packet of said plurality of data packets;

padding the remaining data packets with a suitable bit pattern, thereby generating a plurality of padded data packets at least equal in packet length to the longest data packet;

generating a parity packet from said plurality of padded data packets; and transmitting the plurality of data packets and the parity packet to the target computer system.

2. The method of claim 1 wherein said parity packet includes the packet lengths of the plurality of data packets.

3. The method of claim 1 wherein the parity packet is generated using an "XOR" operation on the plurality of padded data packets.

4. The method of claim 1 wherein the suitable bit pattern includes "0" bits.

5. The method of claim 1 wherein the plurality of data packets include video data packets and audio data packets.

6. The method of claim 1 wherein the plurality of data packets are interleaved.

7. A transmitting computer system useful in association with a target computer system, said transmitting computer system coupled to said target computer system via a network, said transmitting computer system comprising:

a parity packet generator configured to determine the length of a longest data packet of said plurality of data packets, and configured to pad the remaining data packets with a suitable bit pattern, thereby generating a plurality of padded data packets at least equal in packet length to the longest data packet, thereby generating a parity packet from said plurality of padded data packets; and a packet transmitter configured to transmit the plurality of data packets and the parity packet to the target computer system.

8. The transmitting computer system of claim 7 wherein said parity packet includes the packet lengths of the plurality of data packets.

9. The transmitting computer system of claim 7 wherein the parity packet is generated using an "XOR" operation on the plurality of padded data packets.

10. The transmitting computer system of claim 7 wherein the suitable bit pattern includes "0" bits.

11. The transmitting computer system of claim 7 wherein the plurality of data packets include video data packets and audio data packets.

12. The transmitting computer system of claim 7 wherein the plurality of data packets are interleaved.

13. In a target computer system, a method for recovering a corrupted or lost data packet, wherein the corrupted or lost data packet is one of a plurality of data packets transmitted from a transmitting computer system to the target computer system, the transmitting computer system and the target computer system coupled to each other via a computer network, and wherein at least two of said plurality of data packets having different packet lengths, the method comprising:

receiving at least one data packet of said plurality of data packets;

receiving a parity packet;

padding the received at least one data packet with a suitable bit pattern upon detecting a lost or corrupted data packet of said plurality of data packets, the received at least one data packet padded to at least the length of the lost or corrupted data packet; and computing the lost or corrupted data packet from said padded at least one data packet and said parity packet upon detecting a lost or corrupted data packet of said plurality of data packets.

14. The method of claim 13 wherein the parity packet was previously generated using an "XOR" operation on the plurality of data packets by said transmitting computer system.

15. The method of claim 13 wherein the suitable bit pattern includes "0" bits.

16. The method of claim 13 wherein the plurality of data packets include video data packets and audio data packets.

17. The method of claim 13 wherein the plurality of data packets are interleaved.

18. A target computer system useful in association with a transmitting computer system, said transmitting computer system coupled to said target computer system via a network, said target computer system comprising:

a packet receiver configured to receive at least one data packet of a plurality of data packets from said transmitting computer system, and configured to receive a parity packet, and wherein at least two of said plurality of data packets having different packet lengths;

a packet loss detector configured to detect a lost or corrupted data packet of said plurality of data packets; and a packet reconstructor configured to pad the received at least one data packet with a suitable bit pattern, the received at least one data packet padded to at least the length of the lost or corrupted data packet, and configured to compute the lost or corrupted data packet from said padded at least one data packet and said parity packet.

19. The target computer system of claim 18 wherein the parity packet was previously generated using an "XOR" operation on the plurality of data packets by said transmitting computer system.

20. The target computer system of claim 18 wherein the suitable bit pattern includes "0" bits.

21. The target computer system of claim 18 wherein the plurality of data packets include video data packets and audio data packets.

22. The target computer system of claim 18 wherein the plurality of data packets are interleaved.

23. A computer readable medium having computer-executable instructions comprising:

determining the length of a longest data packet of a plurality of data packets, wherein at least two of the plurality of data packets have different packet lengths;

padding the remaining data packets with a suitable bit pattern, thereby generating a plurality of padded data packets at least equal in packet length to the longest data packet;

generating a parity packet from said plurality of padded data packets; and transmitting the plurality of data packets and the parity packet.

24. The computer readable medium of claim 23, wherein said parity packet includes the packet lengths of the plurality of data packets.

25. The computer readable medium of claim 23, wherein the parity packet is generated using an "XOR" operation on the plurality of padded data packets.

26. The computer readable medium of claim 23, wherein the suitable bit pattern includes "0" bits.

27. The computer readable medium of claim 23, wherein the plurality of data packets include video data packets and audio data packets.

28. The computer readable medium of claim 23, wherein the plurality of data packets are interleaved.

29. A computer readable medium having computer-executable instructions comprising:

receiving at least one data packet of a plurality of data packets;

receiving a parity packet;

padding the received at least one data packet with a suitable bit pattern upon detecting a lost or corrupted data packet of said plurality of data packets, the received at least one data packet padded to at least the length of the lost or corrupted data packet; and computing the lost or corrupted data packet from said padded at least one data packet and said parity packet upon detecting a lost or corrupted data packet of said plurality of data packets.

30. The computer readable medium of claim 29, wherein the parity packet was previously generated using an "XOR" operation on the plurality of data packets by said transmitting computer system.

31. The computer readable medium of claim 29, wherein the suitable bit pattern includes "0" bits.

32. The computer readable medium of claim 29, wherein the plurality of data packets include video data packets and audio data packets.

33. The computer readable medium of claim 29, wherein the plurality of data packets are interleaved.

* * * * *